(12) United States Patent
Tena Gil et al.

(10) Patent No.: US 11,165,178 B2
(45) Date of Patent: Nov. 2, 2021

(54) ELECTRICAL INTERCONNECTION SYSTEM AND METHOD FOR ELECTRICALLY INTERCONNECTING ELECTRICAL COMPONENTS OF A MODULE

(71) Applicant: Lear Corporation, Southfield, MI (US)

(72) Inventors: Marc Tena Gil, Valls (ES); Josep Maria Roset Rubio, Valls (ES); Jose Gabriel Fernandez Banares, Valls (ES); Antonio Tomas Amenos, Valls (ES)

(73) Assignee: LEAR CORPORATION, Southfield, MI (US)

( * ) Notice: Subject to any disclaimer, the term of this patent is extended or adjusted under 35 U.S.C. 154(b) by 0 days.

(21) Appl. No.: 16/674,193

(22) Filed: Nov. 5, 2019

(65) Prior Publication Data

US 2021/0135384 A1    May 6, 2021

(51) Int. Cl.
*H01R 12/70*    (2011.01)
*H05K 1/02*    (2006.01)
(Continued)

(52) U.S. Cl.
CPC ......... *H01R 12/7076* (2013.01); *H01R 12/58* (2013.01); *H05K 1/0201* (2013.01); *H05K 1/0218* (2013.01); *H05K 1/144* (2013.01); *H05K 3/368* (2013.01); *B60K 6/22* (2013.01); *B60R 16/0231* (2013.01); *B60Y 2200/91* (2013.01); *B60Y 2200/92* (2013.01); *H05K 2201/042* (2013.01); *H05K 2201/09227* (2013.01); *H05K 2201/09245* (2013.01); *H05K 2201/09272* (2013.01); *H05K 2201/10272* (2013.01);
(Continued)

(58) Field of Classification Search
CPC .. H01R 9/097; H01R 12/523; H01R 12/7076; H01R 12/58; H05K 1/0218; H05K 1/0201; H05K 1/144; H05K 3/368; H05K 3/2201; H05K 3/09227; H05K 3/10272; H05K 3/09272; H05K 3/042; H05K 3/09245; H05K 3/10303; H05K 2203/166; H05K 2203/302; B60Y 2200/92; B60Y 2200/91; B60R 16/0231; B60K 6/22
USPC .......................................................... 439/75
See application file for complete search history.

(56) References Cited

U.S. PATENT DOCUMENTS 5,667,389 A * 9/1997 Kidd ................... B60R 16/0238
                                                                      439/75
5,761,050 A * 6/1998 Archer ................. H01R 12/585
                                                                      361/744

(Continued)

*Primary Examiner* — Gary F Paumen
(74) *Attorney, Agent, or Firm* — Brooks Kushman P.C.

(57) ABSTRACT

An electrical interconnection system for electrical components of a module includes a hub printed circuit board (PCB) having a first electrically conductive track and a second electrically conductive track. Each of the first and second electrically conductive tracks is configured to electrically connect at least two of the electrical components of the module, wherein the at least two of the electrical components of the module are external to the hub PCB. The system also includes multiple electrical terminals, wherein each of the electrical terminals is configured to electrically connect one of the first and second electrically conductive tracks of the hub PCB to one of the at least two electrical components of the module.

20 Claims, 4 Drawing Sheets

(51) Int. Cl.
*H05K 3/36* (2006.01)
*H05K 1/14* (2006.01)
*H01R 12/58* (2011.01)
*B60R 16/023* (2006.01)
*B60K 6/22* (2007.10)

(52) U.S. Cl.
CPC .............. *H05K 2201/10303* (2013.01); *H05K 2203/166* (2013.01); *H05K 2203/302* (2013.01)

(56) References Cited

U.S. PATENT DOCUMENTS

| | | | |
|---|---|---|---|
| 5,825,630 A * | 10/1998 | Taylor | H05K 1/141 361/790 |
| 6,503,090 B2 * | 1/2003 | Onizuka | H01R 12/58 439/75 |
| 7,247,031 B2 * | 7/2007 | Naito | H01R 9/2458 439/75 |
| 7,417,195 B2 | 8/2008 | Totani et al. | |
| 8,899,995 B2 * | 12/2014 | Bulur | H05K 1/18 429/122 |
| 2007/0156938 A1 | 7/2007 | Wu et al. | |
| 2008/0227312 A1 * | 9/2008 | Ogata | H05K 3/4046 439/75 |
| 2009/0061656 A1 * | 3/2009 | Tanaka | H05K 3/368 439/75 |
| 2010/0000088 A1 | 1/2010 | Legtenberg | |
| 2014/0162470 A1 * | 6/2014 | Fricker | H01R 12/724 439/65 |
| 2014/0177169 A1 * | 6/2014 | Restrepo | H05K 5/0247 361/692 |
| 2014/0315398 A1 * | 10/2014 | Feigl | H05K 3/368 439/66 |
| 2015/0079817 A1 * | 3/2015 | Hashiguchi | H01R 43/205 439/75 |
| 2015/0303596 A1 * | 10/2015 | Nagai | H05K 1/144 439/75 |
| 2016/0072235 A1 * | 3/2016 | Strelow | H01R 4/2433 439/660 |

\* cited by examiner

ELECTRICAL INTERCONNECTION SYSTEM AND METHOD FOR ELECTRICALLY INTERCONNECTING ELECTRICAL COMPONENTS OF A MODULE

TECHNICAL FIELD

The following relates to an electrical interconnection system for electrical components of a module and a method for electrically interconnecting electrical components of a module.

BACKGROUND

The electric/electronic modules needed in electric and hybrid electric vehicles handle electric energies of thousands of watts. The electrical components that are required to do so are bulky and heavy, and consequently cannot be assembled into printed circuit boards (PCBs). As a result, such components must be fixed to the module housing and interconnection means must be provided to connect those components to each other and to PCBs with smaller electrical components, such as controllers, filters, etc. The modules utilize internal wiring to provide the required electrical connections. Due to the value of currents and the different component structures, separate connecting wires with heavier gauges are required, which therefore have relatively thick cross-sections given the size of the conductors and their associated sheaths or insulation. Moreover, layout restrictions within the module force the cables or wires to cross over each other. As a result of their thicknesses and crossed routing, the cables or wires can potentially physically interfere with other internal elements or the closure of the cover of the module housing, thereby creating quality risks. This means that routing and fixation elements must be integrated with such wiring. Fixed routing of the wires also has a significant effect on the electromagnetic compatibility (EMC) of the modules. Still further, the manufacturing process requires many manual assembly steps, which result in longer assembly times and more opportunities for errors than in an automated assembly. Moreover, due to the current values, dissipation losses are relevant, with some of the components requiring direct contact to the housing where a cooling-liquid cavity (or heat sink) is placed.

Figure 1:
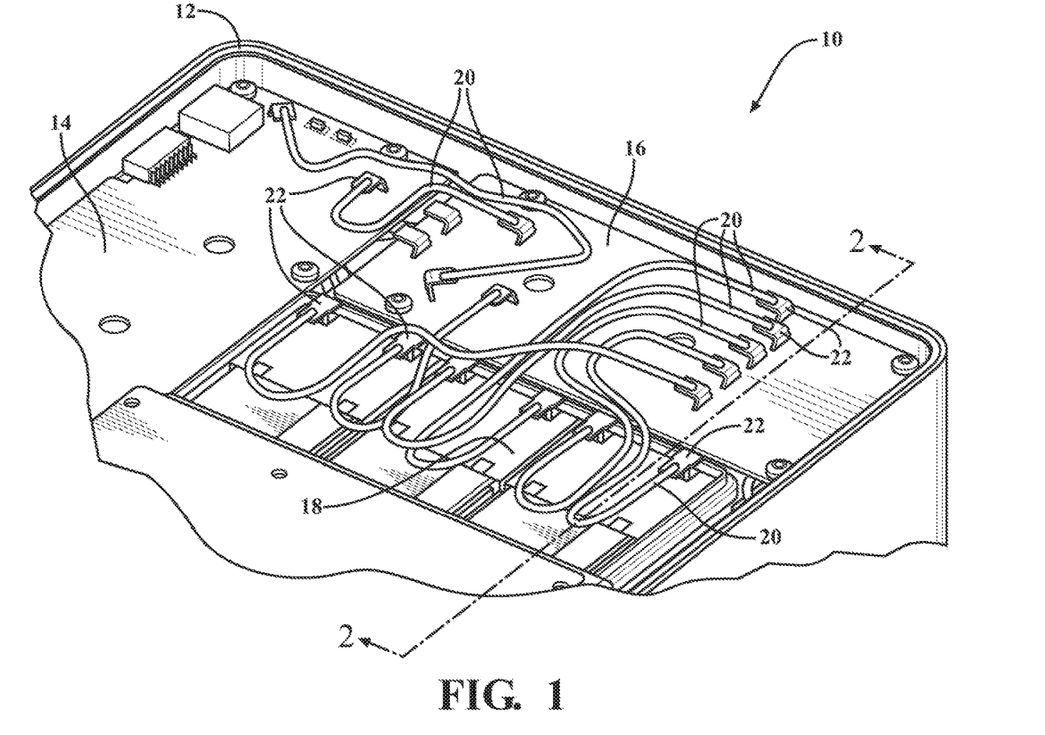
FIG. 1 is a partial perspective view of a prior art electrical interconnection system for electrical components of a module.

In that regard, a partial perspective view of a prior art electrical interconnection system for electrical components of a module is shown in FIG. 1. As seen therein, an on-board charger (OBC) module 10 for an electric or hybrid electric vehicle has a housing 12 for electrical components including a DC-to-DC primary printed circuit board (PCB) 14, an OBC secondary PCB 16, and an assembly 18 with transformer and resonant coils, which may be referred to as a transformer plus resonant block. Electrical interconnection of the DC-to-DC primary PCB 14, the OBC secondary PCB 16, and the transformer plus resonant block 18 is achieved using cables or wires 20 routed between and connected to terminals 22 of the DC-to-DC primary PCB 14, OBC secondary PCB 16, and transformer plus resonant block 18.

Figure 2:
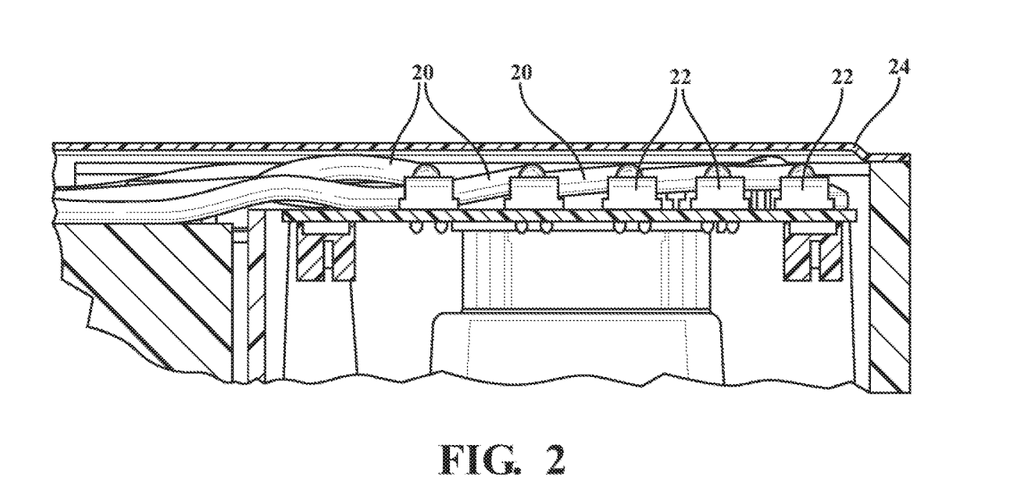
FIG. 2 is cross-sectional view of the prior art electrical interconnection system for electrical components of a module shown in FIG. 1.

FIG. 2 is a cross-sectional of the prior art electrical interconnection system for electrical components of the OBC module 10 shown in FIG. 1, taken along line 2-2. In that regard, the DC-to-DC primary PCB 14, OBC secondary PCB 16, and transformer plus resonant block 18 may be required to operate at high AC or DC currents and voltages. As a result, the cables or wires 20 interconnecting the DC-to-DC primary PCB 14, the OBC secondary PCB 16, and the transformer plus resonant block 18 are required to have a heavier gauge, and consequently have relatively thick cross-sections given the size of the conductors and their associated sheaths or insulation. Moreover, layout restrictions within the OBC module 10 force the cables or wires 20 to cross over each other. As a result of their thickness and crossed routing, the cables or wires 20 can potentially physically interfere with the placement and closure of a cover 24 for the OBC module 10, thereby creating quality risks.

More specifically, quality risks associated with closure of the cover 24 may lead to trapping of the cables or wires 20, or to a reduction of isolation distances for the cables or wires 20. Quality risks also necessitate robust connections of the cables or wires 20, such as with screw and ring terminals 28 (see FIG. 3), and poka-yoke (i.e., mistake-proof) mechanisms and/or procedures. Still further, routing of the cables or wires 20 must be stable to ensure electromagnetic compatibility (EMC). A risk also exists that the cables or wires 20 may be improperly connected to the electrical components 14, 16, 18 of the module 10.

Figure 3:
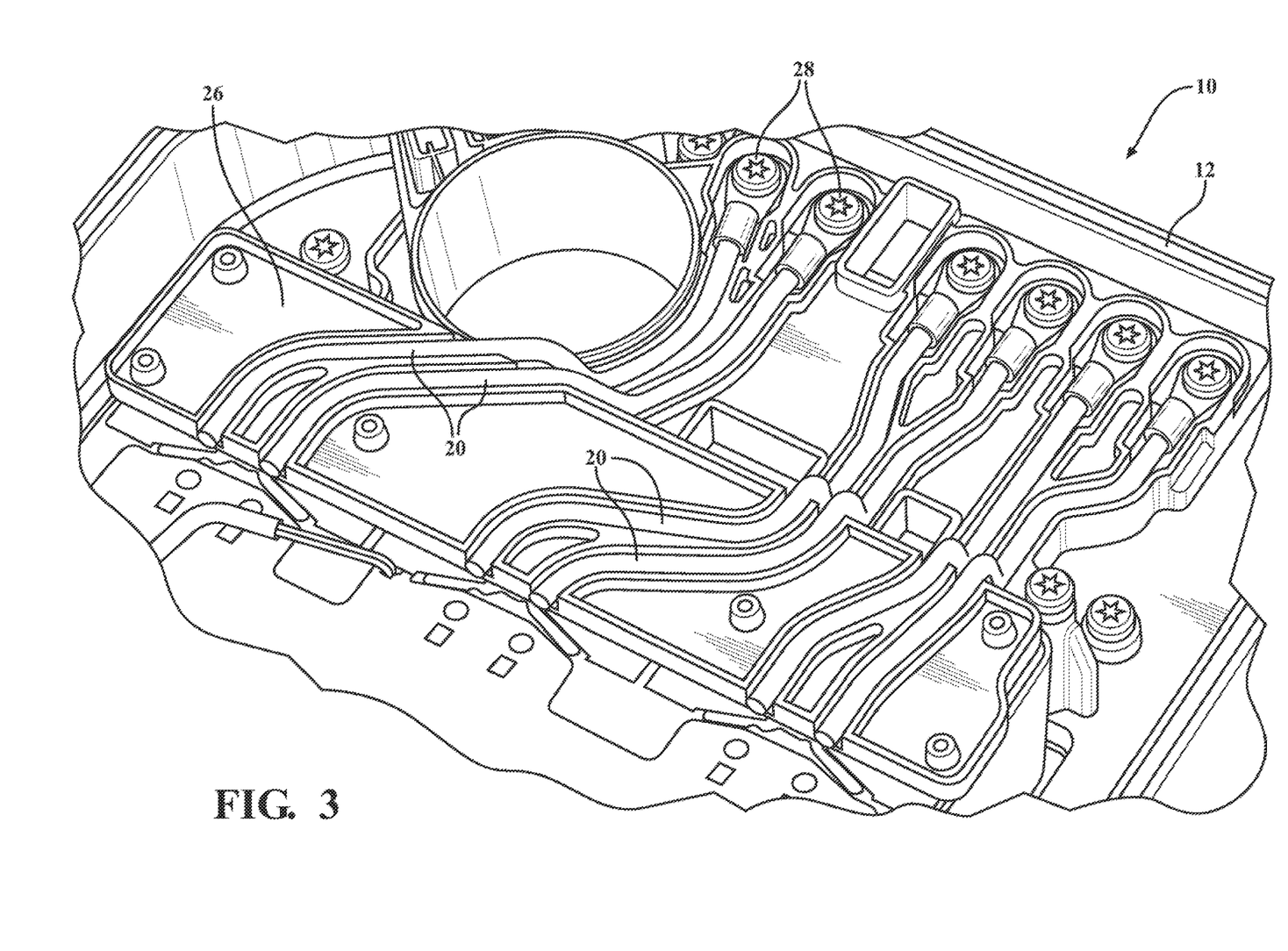
FIG. 3 is a partial perspective view of another prior art electrical interconnection system for electrical components of a module.

In that regard, FIG. 3 shows a partial perspective view of another prior art electrical interconnection system for electrical components of a module. As seen therein, a plastic guide frame 26 having wires or cables 20 included therein may be provided to ensure proper routing and fixation of the wires or cables 20 required for the module, providing clearance and electromagnetic compatibility (EMC) and using screw and ring terminals 28. However, adding such a guide frame 26 results in increased costs associated with the module.

A need therefore exists for an improved electrical interconnection system for electrical components in a module and an improved method for electrically interconnecting electrical components in a module. Such an improved electrical interconnection system and method would overcome the above-noted problems associated with prior art electrical interconnection systems for electrically connecting electrical components in a module.

SUMMARY

According to one non-limiting exemplary embodiment described herein, an electrical interconnection system for electrical components of a module is provided. The system comprises a hub printed circuit board (PCB) comprising a first electrically conductive track and a second electrically conductive track, wherein each of the first and second electrically conductive tracks is configured to electrically connect at least two of the electrical components of the module, wherein the at least two of the electrical components of the module are external to the hub PCB. The system further comprises a plurality of electrical terminals, wherein each of the plurality of electrical terminals is configured to electrically connect one of the first and second electrically conductive tracks of the hub PCB to one of the at least two electrical components of the module.

According to another non-limiting exemplary embodiment described herein, an electrical interconnection system for electrical components of a module is provided, each of the electrical components comprising an electrical assembly or a printed circuit board (PCB). The system comprises a hub PCB comprising a first layer and a second layer, the first layer having a first electrically conductive track and the second layer having a second electrically conductive track, wherein each of the first and second electrically conductive tracks is configured to electrically connect at least two of the electrical components of the module. The system further comprises a plurality of electrical terminals, wherein each of the plurality of electrical terminals is configured to electrically connect one of the first and second electrically conductive tracks of the hub PCB to one of the electrical components of the module.

According to another non-limiting exemplary embodiment described herein, a method is provided for electrically interconnecting electrical components of a module via a hub printed circuit board (PCB) comprising a first electrically conductive track and a second electrically conductive track, each configured to electrically connect at least two of the electrical components of the module external to the hub PCB, the hub PCB further comprising a plurality of electrical terminals, each configured to electrically connect one of the first and second electrically conductive tracks of the hub PCB to one of the at least two electrical components of the module. The method comprises aligning each of the plurality of electrical terminals of the hub PCB with a corresponding cooperative electrical terminal arranged at a location on one of the at least two electrical components. The method further comprises connecting each of the plurality of electrical terminals of the hub PCB to the corresponding cooperative electrical terminal in a single step.

A detailed description of these and other non-limiting exemplary embodiments of an electrical interconnection system for electrical components of a module and a method for electrically interconnecting electrical components of a module is set forth below together with accompanying drawings.

DETAILED DESCRIPTION

As required, detailed non-limiting embodiments are disclosed herein. However, it is to be understood that the disclosed embodiments are merely exemplary and may take various and alternative forms. The figures are not necessarily to scale, and features may be exaggerated or minimized to show details of particular components, elements, features, items, members, parts, portions, or the like. Therefore, specific structural and functional details disclosed herein are not to be interpreted as limiting, but merely as a representative basis for teaching one skilled in the art.

With reference to the Figures, a more detailed description of non-limiting exemplary embodiments of an electrical interconnection system for electrical components of a module and a method for electrically interconnecting electrical components of a module will be provided. For ease of illustration and to facilitate understanding, like reference numerals have been used herein for like components and features throughout the drawings.

Figure 4:
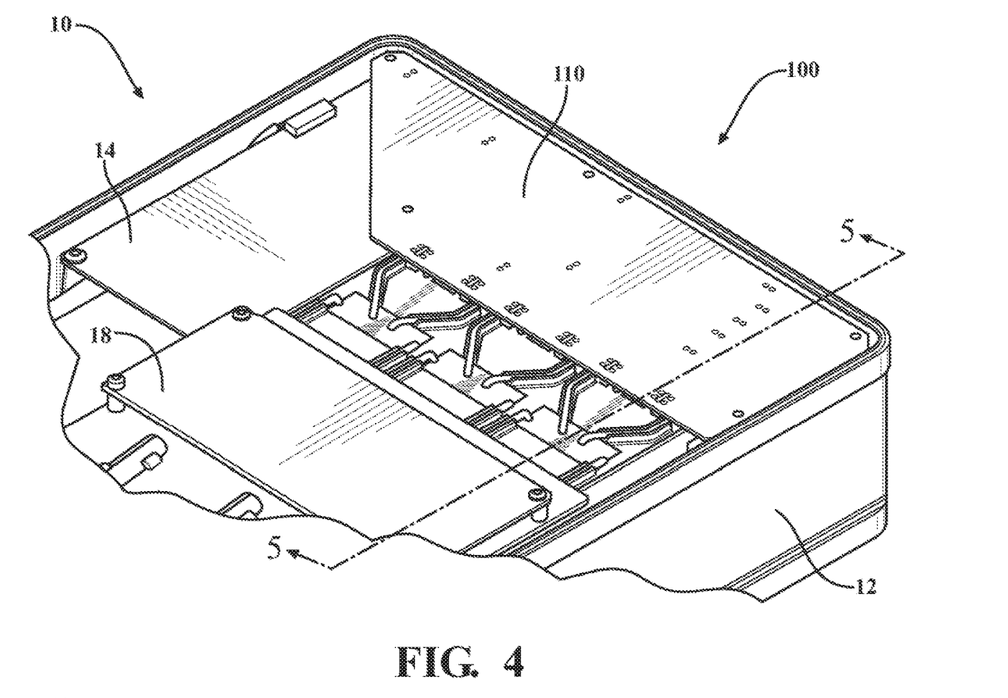
FIG. 4 is a partial perspective view of an exemplary embodiment of an electrical interconnection system for electrical components of a module according to the present disclosure.
Figure 5A:
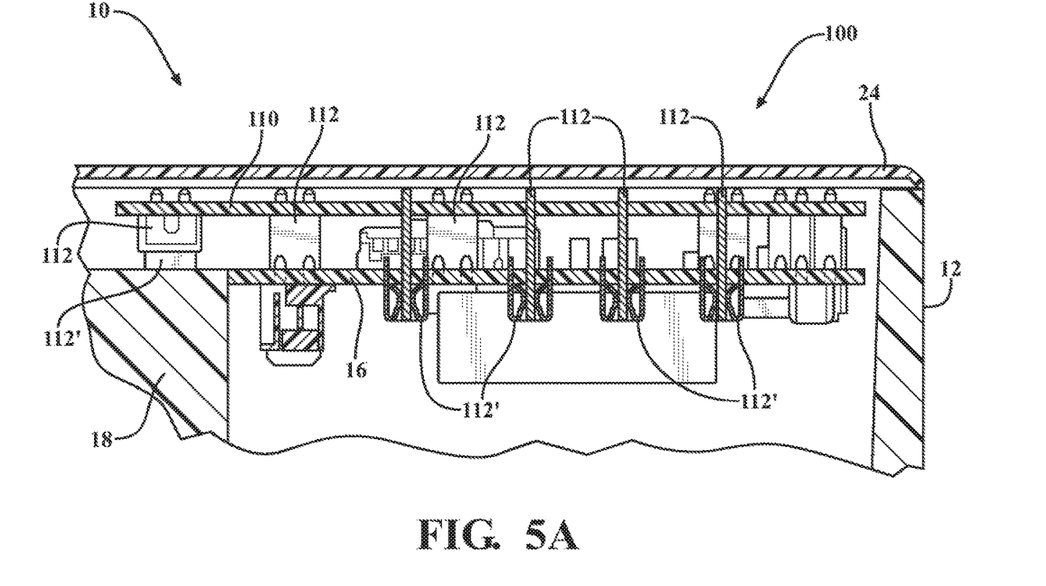
FIG. 5A is a cross-sectional view of the exemplary embodiment of an electrical interconnection system for electrical components of a module shown in FIG. 4.

In that regard, FIG. 4 is a partial perspective view of an exemplary embodiment of an electrical interconnection system 100 for electrical components of a module 10 according to the present disclosure. FIG. 5A is a cross-sectional view of the exemplary embodiment of an electrical interconnection system 100 for electrical components of the module 10 shown in FIG. 4, taken along line 5-5.

As seen therein, the module may again take the form of an OBC charger 10 comprising a DC-to-DC primary PCB 14, OBC secondary PCB 16, and transformer plus resonant block 18. The cables or wires 20 described in connection with the prior art electrical interconnection systems of FIGS. 1-3 are replaced in the exemplary embodiment of an electrical interconnection system 100 shown in FIGS. 4 and 5A with a hub PCB 110. Electrical interconnection of the DC-to-DC primary PCB 14, OBC secondary PCB 16, and transformer plus resonant block 18 is accomplished with electrically conductive tracks 120a, 120b, 120c, 120d, 120e (see FIGS. 6 and 7) provided on a surface of and/or embedded partially or fully within the hub PCB 110, which may have a single or multi-layer construction.

In that regard, electrical connections between the hub PCB 110 and the DC-to-DC primary PCB 14, OBC secondary PCB 16, and transformer plus resonant block 18 are achieved with mating male-to-female connectors or terminals 112, 112', which may be of any known type. The terminals 112 may be attached to the hub PCB 110 by wave soldering, reflow-oven soldering, conductive adhesive, a mechanically-pressed contact, or any other know technique or mechanism.

Figure 5B:
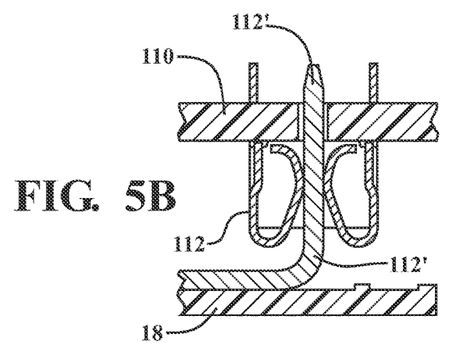
FIG. 5B is a partial cross-sectional view of an exemplary electrical terminal for an exemplary embodiment of an electrical interconnection system for electrical components of a module according to the present disclosure.
Figure 5C:
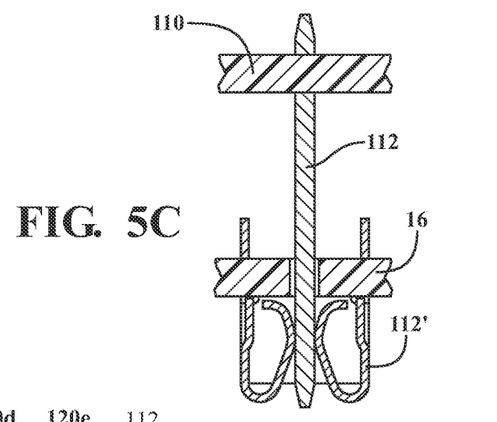
FIG. 5C is another partial cross-sectional view of another exemplary electrical terminal for an exemplary embodiment of an electrical interconnection system for electrical components of a module according to the present disclosure.

The terminals 112 of the hub PCB 110 may be arranged at locations on the hub PCB 110 such that the terminals 112 may be simply plugged into or receive corresponding mating electrical terminals 112' arranged at locations on one of the DC-to-DC primary PCB 14, the OBC secondary PCB 16, and the transformer plus resonant block 18 of the OBC module 10. In that regard, partial cross-sectional views of exemplary corresponding cooperative electrical terminals 112, 112' are shown in FIGS. 5B and 5C. The hub PCB 110 may also be fixed mechanically in or to the module 10 with any type of standard mechanical fasteners (not shown). The interconnection system 100 with hub PCB 110 is thus simple, with one side insertion and wave soldering. Thereby, simple manufacturing and assembly operations are provided that complete all required electrical connections.

The electrical interconnection system 100 and method of the present disclosure thus provide for easier and faster assembly for the connection process of electrical components in a module. The electrical interconnection system 100 of the present disclosure is also more compact, having a reduced height, thereby overcoming the problems of interference with and closure of a module cover 24 associated with prior art electrical connection systems. Assembly of the electrical interconnection system 100 of the present disclosure is also error-free by design, as the system design eliminates the possibility of cross power or erroneous connections between electrical components of a module. The electrical interconnection system 100 of the present disclosure is also cost-effective because a smaller area is needed for electrical connections, which can be accomplished without screws or cable terminals, and because it eliminates the need for any plastic guide frame for electrical wires or cables.

Still further, the electrical interconnection system 100 of the present disclosure also more easily achieves isolation requirements either by virtue of the hub PCB structure, which may include multiple layers and/or coatings, and/or with inexpensive additions such as plastic sheets. The electrical interconnection system 100 of the present disclosure also provides for design flexibility for different modules and electrical components thereof, due to the benefits of PCB technologies and development processes.

Figure 6:
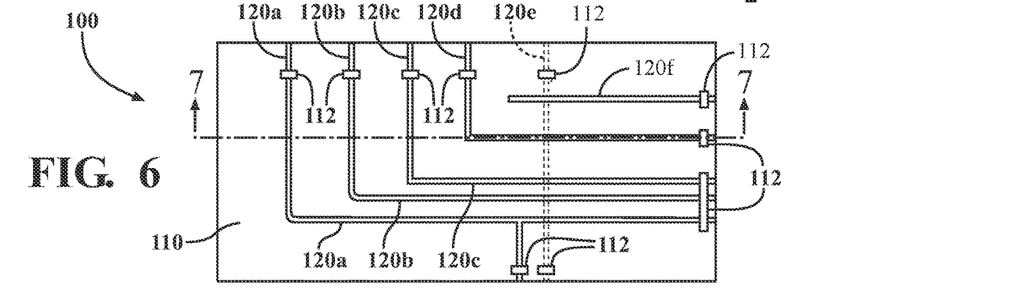
FIG. 6 is a top view of an exemplary hub printed circuit board (PCB) for an exemplary embodiment of an electrical interconnection system for electrical components of a module according to the present disclosure.
Figure 7:
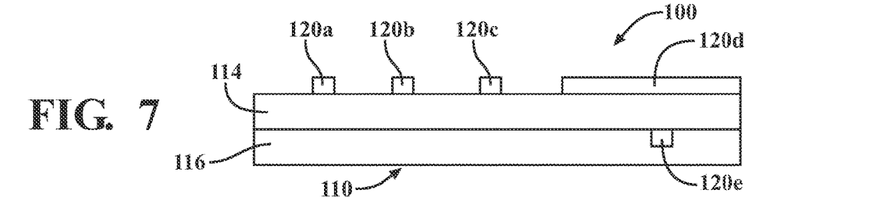
FIG. 7 is a cross-sectional view of the exemplary hub PCB for an exemplary embodiment of an electrical interconnection system for electrical components of a module shown in FIG. 6.

Referring next to FIG. 6, a top view is shown of an exemplary hub PCB 110 for an exemplary embodiment of an electrical interconnection system 100 for electrical components of a module according to the present disclosure. In that regard, FIG. 7 is a cross-sectional view of the exemplary hub PCB 110 for an exemplary embodiment of an electrical interconnection system 100 for electrical components of a module shown in FIG. 6, taken along line 7-7.

As seen therein, and with continuing reference to FIGS. 4 and 5A-5C, in one non-limiting exemplary embodiment, an electrical interconnection system 100 for electrical components of a module is provided. As previously described, the module may be an OBC 10 and the electrical components may be a DC-to-DC primary PCB 14, OBC secondary PCB 16, and transformer plus resonant block 18. However, it should be noted that the module may be any type of module and the electrical components of the module may be any type of electrical components, such as for example an electrical assembly, block, PCB, transformer, inductor, capacitor, resistor, power module, connector, fuse, or any type of discrete electrical component.

The system 100 may comprise a hub PCB 110, which may have a single layer construction or may comprise multiple layers, such as layers 114, 116. In that regard, layers 114, 116 of the hub PCB 110 may comprise any known type of isolating substrate. The hub PCB 110 may comprise a first electrically conductive track, such as any one of tracks 120*a*, 120*b*, 120*c*, 120*d*, 120*e*, and a second electrically conductive track, such as any other one of tracks 120*a*, 120*b*, 120*c*, 120*d*, 120*e*. Each of the first and second electrically conductive tracks 120*a*, 120*b*, 120*c*, 120*d*, 120*e* may be configured to electrically connect at least two of the electrical components 14, 16, 18 of the module 10. In that regard, it should be noted that the at least two of the electrical components 14, 16, 18 of the module 10 electrically interconnected by the first and second electrically conductive tracks 120*a*, 120*b*, 120*c*, 120*d*, 120*e* are separate from, located off of, or external to the hub PCB 110. It should also be noted that such electrical components external to the hub PCB 110 may be internal to the module 10, such as for example a transformer, or external to the module 10, such as for example an electrical connector. As also seen in FIG. 6, one or more of the electrically conductive tracks, e.g., 120*a*, could be configured to form a connection to a third electrical component.

The electrical interconnection system 100 may further comprise a plurality of electrical terminals 112. In that regard, each of the plurality of electrical terminals 112 may be configured to electrically connect one of the first and second electrically conductive tracks 120*a*, 120*b*, 120*c*, 120*d*, 120*e* of the hub PCB 110 to one of the at least two electrical components 14, 16, 18 of the module 10. The electrical terminals 112 may be through-hole technology (THT) or surface-mount technology (SMT) and may be male or female terminals. The electrical terminals 112 may also be grouped with plastic frames (terminal headers).

As seen in FIG. 7, the hub PCB 110 may comprise a first layer 114 comprising a first electrically conductive track 120*a*, 120*b*, 120*c*, 120*d* and a second layer 116 comprising a second electrically conductive track 120*e* in different planes. At least a portion of a first electrically conductive track 120*d* and at least a portion of a second electrically conductive track 120*e* may be non-coplanar and the at least a portion of the first electrically conductive track 120*d* may cross over or under the at least a portion of the second electrically conductive track 120*e*. In that regard, one or more electrically conductive tracks 120*a*, 120*b*, 120*c*, 120*d*, 120*e* could alternatively traverse two or more layers 114, 116 of the hub PCB 110. It should also be noted that any or all of the electrically conductive tracks 120*a*, 120*b*, 120*c*, 120*d*, 120*e* of the hub PCB 110 may be configured with rounded corners for improved electromagnetic compatibility (EMC).

Moreover, the number, shapes, sizes, locations, and configurations of the electrically conductive tracks 120*a*, 120*b*, 120*c*, 120*d*, 120*e* and layers 114, 116 of the hub PCB 110 shown in FIG. 7 are exemplary only. The hub PCB 110 may comprise a single layer or any number of layers, and may be provided with any number or configuration of electrically conductive tracks having any shapes or sizes and located at, on, or integrated in (partially of fully) a single layer or multiple layers of the hub PCB 110.

It should be further noted that any of the electrically conductive tracks 120*a*, 120*b*, 120*c*, 120*d*, 120*e* of the hub PCB 110 may comprise traces formed on or in a surface of the hub PCB 110. In that same regard, any of the electrically conductive tracks 120*a*, 120*b*, 120*c*, 120*d*, 120*e* of the hub PCB 110 may be partially or fully integrated in the hub PCB 110 or any layer 114, 116 of the hub PCB 110. It should further be noted that any of the electrically conductive tracks 120*a*, 120*b*, 120*c*, 120*d*, 120*e* of the hub PCB 110 may comprise a busbar, which may be formed on a surface of the hub PCB 110 or which may be partially or fully integrated in the hub PCB 110 or any layer 114, 116 of the hub PCB 110. In that regard, such an electrically conductive track 120*a*, 120*b*, 120*c*, 120*d*, 120*e* in the form of a busbar may range across or span more than a single layer 114, 116 of a multilayer hub PCB 110 or even from a top side to a bottom side of the hub PCB 110. Such busbars may be used for specific tracks 120*a*, 120*b*, 120*c*, 120*d*, 120*e* where currents are too high for typical copper traces.

Any or all of the electrically conductive tracks 120*a*, 120*b*, 120*c*, 120*d*, 120*e* of the hub PCB 110 may also be suitably configured as power tracks for operation at high voltages of at least approximately 75 Volts DC or at least approximately 50 Volts AC and/or for carrying an electrical current of at least approximately 15 Amps up to at least approximately 100 Amps. In that regard high voltage and current levels as used herein refer to those conventionally utilized in modules for electrification systems of electric or hybrid electric vehicles, and the busbars previously described may be utilized for high currents. To provide electromagnetic shielding for the electrically conductive tracks 120*a*, 120*b*, 120*c*, 120*d*, 120*e*, the hub PCB 110 may further comprise an electrically conductive shielding track 120*f* (FIG. 6) having a first end configured for electrical connection to one of the electrical components 14, 16, 18 of the module 10 and a second end that terminates without connection to any of the electrical components 14, 16, 18 of the module 10. The hub PCB 110 may also further comprise means to improve thermal dissipation or for dissipating thermal energy, such as specific track layouts or configurations, an internal copper layer, or any known thermal dissipation means or mechanism.

Referring again to FIGS. 4 and 5A-5C, a first one of the electrical components 14, 16, 18 of the module 10 electrically connected to the hub PCB 110 may be arranged in a first plane and a second one of the electrical components 14, 16, 18 of the module 10 electrically connected to the hub PCB 110 may be arranged in a second plane different than the first plane. In that regard, the hub PCB 110 may connect to one or more of the electrical components 14, 16, 18 from a horizontal or vertical orientation or a combination of such orientations if the hub PCB 110 is configured to bend (see FIG. 8). Each of the plurality of electrical terminals 112 may be arranged on the hub PCB at a location for cooperation with a corresponding electrical terminal 112' arranged at a location on one of the electrical components 14, 16, 18 of the module 10. As well, the plurality of electrical terminals 112 may be attached to one of electrically conductive tracks 120*a*, 120*b*, 120*c*, 120*d*, 120*e* of the hub PCB 110 by wave soldering, reflow-oven soldering, conductive adhesive, a mechanically-pressed contact, or any other known technique or mechanism.

With continuing reference to FIGS. 4-7, another non-limiting exemplary embodiment of an electrical interconnection system 100 for electrical components of a module may be provided, wherein each of the electrical components may comprise an electrical assembly or a printed circuit board (PCB). Here again, the module may be an OBC 10 and the electrical components may be a DC-to-DC primary PCB 14, an OBC secondary PCB 16, and a transformer plus resonant block 18. However, it should again be noted that the module may be any type of module and the electrical components of the module may be any type of electrical assembly or PCB.

The electrical interconnection system 10 may comprise a hub PCB 110, which may comprise a first layer 114 and a second layer 116, which layers may comprise any known type of isolating substrate. The first layer 114 may have a first electrically conductive track, such as one of tracks 120*a*, 120*b*, 120*c*, 120*d*, and the second layer 116 may have a second electrically conductive track 120*e*. Once again, each of the electrically conductive tracks 120*a*, 120*b*, 120*c*, 120*d*, 120*e* may be configured to electrically connect at least two of the electrical components 14, 16, 18 of the module 10.

Referring again to FIGS. 4 and 5A-5C, the electrical interconnection system 100 may further comprise a plurality of electrical terminals 112. Each of the plurality of electrical terminals 112 may be configured to electrically connect one of the electrically conductive tracks 120*a*, 120*b*, 120*c*, 120*d*, 120*e* of the hub PCB 110 to one of the electrical components 14, 16, 18 of the module 10. The electrical terminals 112 may be through-hole technology (THT) or surface-mount technology (SMT) and may be male or female terminals. The electrical terminals 112 may also be grouped with plastic frames (terminal headers).

As seen in FIG. 7, at least a portion of a first electrically conductive track 120*d* of the first layer 114 of the hub PCB 110 and at least a portion of a second electrically conductive track 120*e* of the second layer 116 of the hub PCB 110 may be non-coplanar and the at least a portion of the first electrically conductive track 120*d* may cross over or under the at least a portion of the second electrically conductive track 120*e* indifferent planes. In that regard, one or more electrically conductive tracks 120*a*, 120*b*, 120*c*, 120*d*, 120*e* could alternatively traverse two or more layers 114, 116 of the hub PCB 110. It should again be noted that any or all of the electrically conductive tracks 120*a*, 120*b*, 120*c*, 120*d*, 120*e* of the hub PCB 110 may be configured with rounded corners for improved electromagnetic compatibility (EMC).

Here again, the number, shapes, sizes, locations, and configurations of the electrically conductive tracks 120*a*, 120*b*, 120*c*, 120*d*, 120*e* and layers 114, 116 of the hub PCB 110 shown in FIG. 7 are exemplary only. The hub PCB 110 may comprise any number of layers, and may be provided with any number or configuration of electrically conductive tracks having any shapes or sizes and located at, on, or integrated in (partially of or fully) a single layer or multiple layers of the hub PCB 110.

It should also again be noted that any of the electrically conductive tracks 120*a*, 120*b*, 120*c*, 120*d*, 120*e* of the hub PCB 110 may comprise traces formed on or in a surface of the hub PCB 110. In that same regard, any of the electrically conductive tracks 120*a*, 120*b*, 120*c*, 120*d*, 120*e* of the hub PCB 110 may be partially or fully integrated in the hub PCB 110 or any layer 114, 116 of the hub PCB 110. It should further be noted that any of the electrically conductive tracks 120*a*, 120*b*, 120*c*, 120*d*, 120*e* of the hub PCB 110 may comprise a busbar, which may be formed on a surface of the hub PCB 110 or which may be partially or fully integrated in the hub PCB 110 or any layer 114, 116 of the hub PCB 110. Once again, such an electrically conductive track 120*a*, 120*b*, 120*c*, 120*d*, 120*e* in the form of a busbar may range across or span more than a single layer 114, 116 of a multilayer hub PCB 110 or even from a top side to a bottom side of the hub PCB 110. Such busbars may be used for specific tracks 120*a*, 120*b*, 120*c*, 120*d*, 120*e* where currents are too high for typical copper traces.

Any or all of the electrically conductive tracks 120*a*, 120*b*, 120*c*, 120*d*, 120*e* of the hub PCB 110 may also again be suitably configured as power tracks for operation at high voltages of at least approximately 75 Volts DC or at least approximately 50 Volts AC and/or for carrying an electrical current of at least approximately 15 Amps up to at least approximately 100 Amps. Once again, high voltage and current levels as used herein refer to those conventionally utilized in modules for electrification systems of electric or hybrid electric vehicles, and the busbars previously described may be utilized for high currents. To provide electromagnetic shielding for the electrically conductive tracks 120*a*, 120*b*, 120*c*, 120*d*, 120*e*, the hub PCB 110 may further comprise an electrically conductive shielding track 120*f* (FIG. 6) having a first end configured for electrical connection to one of the electrical components 14, 16, 18 of the module 10 and a second end that terminates without connection to any of the electrical components 14, 16, 18 of the module 10. The hub PCB 110 may also further comprise means to improve thermal dissipation or for dissipating thermal energy, such as specific track layouts or configurations, an internal copper layer, or any known thermal dissipation means or mechanism.

With reference again to FIGS. 4 and 5A-5C, a first one of the electrical components 14, 16, 18 of the module 10 electrically connected to the hub PCB 110 may again be arranged in a first plane and a second one of the electrical components 14, 16, 18 of the module 10 electrically connected to the hub PCB 110 may be arranged in a second plane different than the first plane. In that regard, the hub PCB 110 may connect to one or more of the electrical components 14, 16, 18 from a horizontal or vertical orientation or a combination of such orientations if the hub PCB 110 is configured to bend (see FIG. 8). Each of the plurality of electrical terminals 112 may also again be arranged on the hub PCB at a location for cooperation with a corresponding electrical terminal 112' arranged at a location on one of the electrical components 14, 16, 18 of the module 10. As well, each of the plurality of electrical terminals 112 may again be attached to one of electrically conductive tracks 120a, 120b, 120c, 120d, 120e of the hub PCB 110 by wave soldering, reflow-oven soldering, conductive adhesive, a mechanically-pressed contact, or any other known technique or mechanism.

Figure 8:
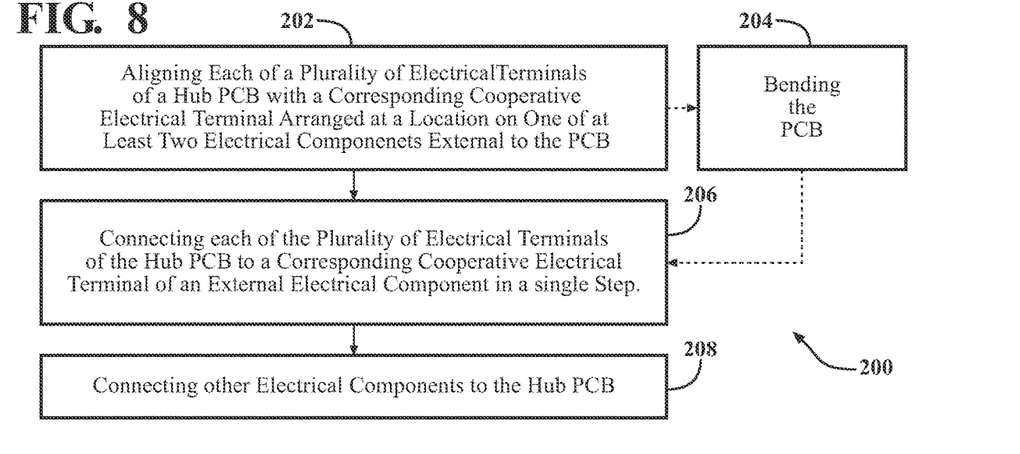
FIG. 8 is a flowchart of an exemplary embodiment of a method for electrically interconnecting electrical components of a module according the present disclosure.

Referring next to FIG. 8, a flowchart is shown of an exemplary embodiment of a method 200 for electrically interconnecting electrical components of a module according to the present disclosure. In that regard, the method 200 is provided for electrically interconnecting electrical components of a module via a hub PCB as described above in connection with the electrical interconnection system 100 of the present disclosure and with reference to FIGS. 4-7. The hub PCB may comprise a first electrically conductive track and a second electrically conductive track, each configured to electrically connect at least two of the electrical components of the module external to the hub PCB. The hub PCB may further comprise a plurality of electrical terminals, each configured to electrically connect one of the first and second electrically conductive tracks of the hub PCB to one of the at least two electrical components of the module.

As seen in FIG. 8, the method 200 may comprise aligning 202 each of the plurality of electrical terminals of the hub PCB with a corresponding cooperative electrical terminal arranged at a location on one of the at least two electrical components. The method 200 may further comprise connecting 206 each of the plurality of electrical terminals of the hub PCB to the corresponding cooperative electrical terminal in a single step. In that regard, as used herein, a single step may comprise simultaneous or substantially simultaneous connection of the plurality of electrical terminals of the hub PCB to the corresponding cooperative electrical terminal of the electrical components. It should be noted that it could also be possible to have some of the components in place in a pre-assembly step (not shown), then assemble the hub PCB and finally assemble another component to the hub PCB. In that event, the hub PCB would be an intermediate step in the interconnection assembly.

Aligning 202 each of the plurality of electrical terminals of the hub PCB with the corresponding cooperative electrical terminal arranged at a location on one of the at least two electrical components may comprise bending 204 the hub PCB. In such a fashion, the hub PCB may provide access to a series of connections far below the surface of the hub PCB. The method 200 may further comprise connecting 208 other electrical components to the hub PCB, which may occur at the same time or substantially the same time as such other electrical components are fixed to the module.

In any embodiment of the electrical interconnection system 100 and method 200 of the present disclosure, other electrical components (not shown) may also be soldered directly to the hub PCB 110. The hub PCB 110 may also be provided with internal layers (not shown) for thermal dissipation or electromagnetic shielding among or between the electrically conductive tracks 120a, 120b, 120c, 120d, 120e. As previously described, to also provide for electromagnetic shielding, one or more electrically conductive tracks may connect at one only one end to a single electrical component 14, 16, 18 and remain unconnected to any electrical component at another end.

It should also be noted that, in any embodiment of the electrical interconnection system 100 and method 200 of the present disclosure, the hub PCB 110 may be provided with cuts or slits (not shown) to separate electrically conductive tracks 120a, 120b, 120c, 120d, 120e with air gaps to increase isolation of the tracks 120a, 120b, 120c, 120d, 120e. As also previously described, the hub PCB 110 may include mechanical fixation means or elements (not shown), such as screwed, snapped-in, glued, guided with frames, or other known types of mechanical fixation, to fix the hub PCB 110 in or to the module 10, to any of the electrical components, and/or to ensure that the electrical connections do not experience mechanical stress.

In any embodiment of the electrical interconnection system 100 and method 200 of the present disclosure, the electrical components 14, 16, 18 may also have other electrical connections, such as to other hub PCBs, wires, busbars, or other elements in the module 10. As previously noted, the hub PCB 110 may also be configured to bend or to be bent at any angle according to known bended-PCB technologies in order to reach all electrical components 14, 16, 18 to be interconnected. In that event, the electrically conductive tracks 120a, 120b, 120c, 120d, 120e may be configured to traverse across a bend in the hub PCB 110 or alternatively may be configured to traverse and be confined to a single plane of a bent hub PCB 110. As well, the hub PCB 110 may be coated to increase or improve isolation capabilities and/or environmental endurance.

As is readily apparent from the foregoing, various non-limiting embodiments of an electrical interconnection system for electrical components of a module and a method for electrically interconnecting electrical components of a module have been described. While various embodiments have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. An electrical interconnection system comprising:
   a module comprising electrical components;
   a hub printed circuit board (PCB) comprising a first electrically conductive track and a second electrically conductive track, wherein each of the first and second electrically conductive tracks is configured to electrically connect at least two of the electrical components of the module, the at least two of the electrical components of the module being separate from the hub PCB, wherein at least one of the first and second electrically conductive tracks is configured for an electrical current of at least 15 Amps, the hub PCB further comprising an electrically conductive shielding track having a first end configured for electrical connection to one of the electrical components of the module and a second end that terminates without connection to any of the electrical components of the module; and a plurality of electrical terminals, wherein each of the plurality of electrical terminals is configured to electrically connect one of the first and second electrically conductive tracks of the hub PCB to one of the at least two electrical components of the module;

wherein the module comprises a vehicle on-board battery charger and one of the at least two electrical components of the module separate from the hub PCB comprises a DC-to-DC primary PCB, an on-board charger secondary PCB, or a transformer plus resonant coils assembly.

2. The system of claim 1 wherein the hub PCB comprises a first layer comprising the first electrically conductive track and a second layer comprising the second electrically conductive track.

3. The system of claim 1 wherein at least a portion of the first electrically conductive track and at least a portion of the second electrically conductive track are non-coplanar and the at least a portion of the first electrically conductive track crosses over or under the at least a portion of the second electrically conductive track.

4. The system of claim 1 wherein at least one of the first and second electrically conductive tracks of the hub PCB comprises a busbar.

5. The system of claim 1 wherein each of the electrical components comprises an electrical assembly or a PCB.

6. The system of claim 1 wherein at least one of the first and second electrically conductive tracks of the hub PCB is configured with rounded corners for electromagnetic compatibility.

7. The system of claim 1 wherein a first one of the electrical components of the module connected to the hub PCB is arranged in a first plane and a second one of the electrical components of the module connected to the hub PCB is arranged in a second plane different than the first plane.

8. The system of claim 1 wherein each of the plurality of electrical terminals is arranged on the hub PCB at a location for cooperation with a corresponding electrical terminal arranged at a location on one of the electrical components of the module.

9. The system of claim 1 wherein each of the plurality of electrical terminals is attached to one of the first and second electrically conductive tracks of the hub PCB by wave soldering, reflow-oven soldering, conductive adhesive, or a mechanically-pressed contact.

10. An electrical interconnection system comprising:
a module comprising electrical components, each of the electrical components comprising an electrical assembly or a printed circuit board (PCB);
a hub PCB comprising a first layer and a second layer, the first layer having a first electrically conductive track and the second layer having a second electrically conductive track, wherein each of the first and second electrically conductive tracks is configured to electrically connect at least two of the electrical components of the module, the at least two of the electrical components of the module being separate from the hub PCB; and
a plurality of electrical terminals, wherein each of the plurality of electrical terminals is configured to electrically connect one of the first and second electrically conductive tracks of the hub PCB to one of the electrical components of the module;
wherein the hub PCB further comprises an electrically conductive shielding track having a first end configured for electrical connection to one of the electrical components of the module and a second end that terminates without connection to any of the electrical components of the module.

11. The system of claim 10 wherein at least a portion of the first electrically conductive track of the first layer crosses over or under at least a portion of the second electrically conductive track of the second layer.

12. The system of claim 10 wherein at least one of the first and second electrically conductive tracks is configured for an electrical current of at least 15 Amps.

13. The system of claim 10 wherein at least one of the first and second electrically conductive tracks is configured for operation at a voltage of at least 75 Volts DC or at least 50 Volts AC.

14. The system of claim 10 wherein a first one of the electrical components of the module connected to the hub PCB is arranged in a first plane and a second one of the electrical components of the module connected to the hub PCB is arranged in a second plane different than the first plane.

15. The system of claim 10 wherein the hub PCB further comprises means for dissipating thermal energy.

16. The system of claim 10 wherein each of the plurality of electrical terminals is arranged on the hub PCB at a location for cooperation with a corresponding electrical terminal arranged at a location on one of the electrical components of the module.

17. The system of claim 10 wherein the module comprises a vehicle on-board battery charger and one of the at least two electrical components comprises a DC-to-DC primary PCB, an on-board charger secondary PCB, or a transformer plus resonant coils assembly.

18. A method for electrically interconnecting electrical components of a module via a hub printed circuit board (PCB), the method comprising:
providing a module comprising electrical components;
providing a hub PCB comprising a first electrically conductive track and a second electrically conductive track, each configured to electrically connect at least two of the electrical components of the module to the hub PCB, the at least two of the electrical components of the module being separate from the hub PCB, the hub PCB further comprising a plurality of electrical terminals, each configured to electrically connect one of the first and second electrically conductive tracks of the hub PCB to one of the at least two electrical components of the module, the hub PCB further comprising an electrically conductive shielding track having a first end configured for electrical connection to one of the electrical components of the module and a second end that terminates without connection to any of the electrical components of the module;
aligning each of the plurality of electrical terminals of the hub PCB with a corresponding cooperative electrical terminal arranged at a location on one of the at least two electrical components; and
connecting each of the plurality of electrical terminals of the hub PCB to the corresponding cooperative electrical terminal in a single step.

19. The method of claim 18 wherein aligning the each of the plurality of electrical terminals of the hub PCB with the corresponding cooperative electrical terminal arranged at a location on one of the at least two electrical components comprises bending the hub PCB.

20. The method of claim 18 wherein the module comprises a vehicle on-board battery charger and one of the at least two electrical components comprises a DC-to-DC primary PCB, an on-board charger secondary PCB, or a transformer plus resonant coils assembly.

* * * * *